US006476663B1

(12) United States Patent
Gauthier et al.

(10) Patent No.: US 6,476,663 B1
(45) Date of Patent: Nov. 5, 2002

(54) METHOD FOR REDUCING SUPPLY NOISE NEAR AN ON-DIE THERMAL SENSOR

(75) Inventors: Claude R. Gauthier, Fremont, CA (US); Brian W. Amick, Austin, TX (US); Tyler J. Thorp, Sunnyvale, CA (US); Dean Liu, Sunnyvale, CA (US); Pradeep R. Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/929,151

(22) Filed: Aug. 14, 2001

(51) Int. Cl.[7] ................................................ H01L 35/00
(52) U.S. Cl. ........................................ 327/513; 327/552
(58) Field of Search ................................ 327/551, 552, 327/512, 513, 371, 378, 403

(56) References Cited

U.S. PATENT DOCUMENTS

| | | | | | |
|---|---|---|---|---|---|
| 4,441,023 | A | * | 4/1984 | Docter et al. | 250/338.3 |
| 5,345,055 | A | * | 9/1994 | Leung | 132/227 |
| 6,040,668 | A | * | 3/2000 | Huynh et al. | 318/138 |
| 6,121,615 | A | * | 9/2000 | Ito | 250/338.3 |
| 6,308,519 | B1 | * | 10/2001 | Bielinski | 136/203 |

* cited by examiner

*Primary Examiner*—Kenneth B. Wells
*Assistant Examiner*—Cassandra Cox
(74) *Attorney, Agent, or Firm*—Rosenthal & Osha L.L.P.

(57) ABSTRACT

A method for reducing power supply noise in the power supply system of a thermal sensor has been developed. The method includes powering up a thermal sensor and inserting a shunting resistance across the power supply terminals. The shunting resistance is inserted in parallel with the thermal sensor.

16 Claims, 2 Drawing Sheets

METHOD FOR REDUCING SUPPLY NOISE NEAR AN ON-DIE THERMAL SENSOR

BACKGROUND OF INVENTION

1. Field of the Invention

The invention relates generally to micro-circuitry design. Specifically, this invention relates to a method for reducing supply noise near an on-die thermal sensor.

2. Background Art

In electronic circuits, the system power supply can be shown as an equivalent circuit 10 as shown in FIG. 1. Specifically, the equivalent circuit 10 includes: a system power supply source 12; a system resistance (Rs) 14; a system inductance (Ls) 16; and a system capacitance (Rc) 18. Each of these system components 12, 14, 16, and 18 represent an equivalent value of all of the combined respective components in the power supply system. The performance of the circuit 10 is frequency dependent. As shown in the graph of FIG. 2, as the frequency of the system increases, the resistance of the circuit increases as well. This increase in resistance continues until a peak 20 is reached at a resonance frequency. Finally, the resistance will subside at even higher frequencies.

The rate of increase in the resistance of the circuit as the frequency approaches its resonance value is quantified as a "Q" value. The "Q" value is calculated as $Q=(\sqrt{(L/C)})/R$; where L is the system inductance value; where C is the system capacitance value; and where R is the system resistance value. As shown in FIG. 2, under normal operations, the equivalent circuit 10 has a very high Q value 24 near the resonance frequency. A high current transient with the high Q region of the frequency band causes significant noise in the power supply system. Supply noise can result in such problems as component or logic malfunction, signal interference, temperature variation, etc.

It would be advantageous to decrease the Q value of the power supply system and thereby reduce supply noise. A reduced Q value 26 is also shown in FIG. 2. This Q value 26 would have the advantage of substantially reducing the supply noise of the respective system. FIG. 3 shows a prior art method of reducing the Q value for a thermal sensor power supply system. A thermal sensor 32 is a component that may be included in an integrated circuit or "chip". The thermal sensor 32 monitors the temperature of a specific local region of the chip and it may serve as a trouble-shooting device should the temperature get too hot. The thermal sensor 32 is just one of many types of components that are commonly included in an integrated circuit. Each of these components often has a dedicated power supply that is unique and separate from the power supplies of other components. The prior art method used in FIG. 3 involves inserting a de-coupling capacitor 34 across the power supply in parallel with the thermal sensor 32. However, the capacitor 34 takes up a significant amount of space on the chip. With chip space at a premium, a space efficient method of reducing power supply noise for a thermal sensor is needed.

SUMMARY OF INVENTION

In some aspects, the invention relates to a method for reducing power supply noise of a thermal sensor, comprising: supplying power to a thermal sensor; and connecting a resistance in parallel with the thermal sensor.

In another aspect, the invention relates to a method for reducing power supply noise of a thermal sensor, comprising: step of supplying power to a thermal sensor; and step of shunting a resistance in parallel with the thermal sensor.

In another aspect, the invention relates to an apparatus for reducing power supply noise of a thermal sensor, comprising: a thermal sensor; a power supply system connected to the thermal sensor; and a shunting resistor connected across the power supply system in parallel with the thermal sensor.

In another aspect, the invention relates to an apparatus for reducing power supply noise of a thermal sensor, comprising: means of supplying power to a thermal sensor; and means of connecting a resistance in parallel with the thermal sensor.

Other aspects and advantages of the invention will be apparent from the following description and the appended claims.

DETAILED DESCRIPTION

Figure 1:
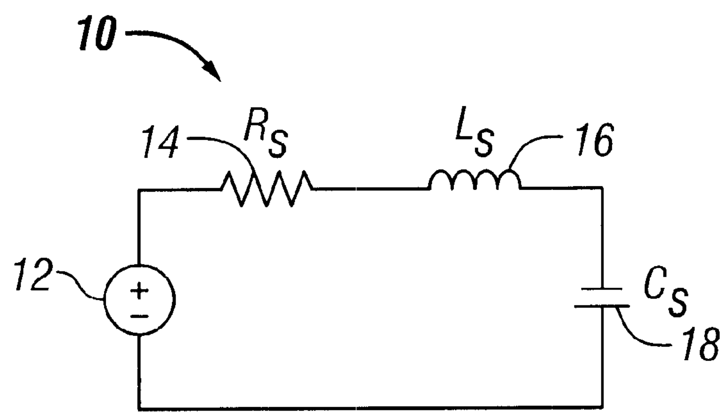
FIG. 1 shows a prior art embodiment of an RLC equivalent power supply system circuit.
Figure 2:
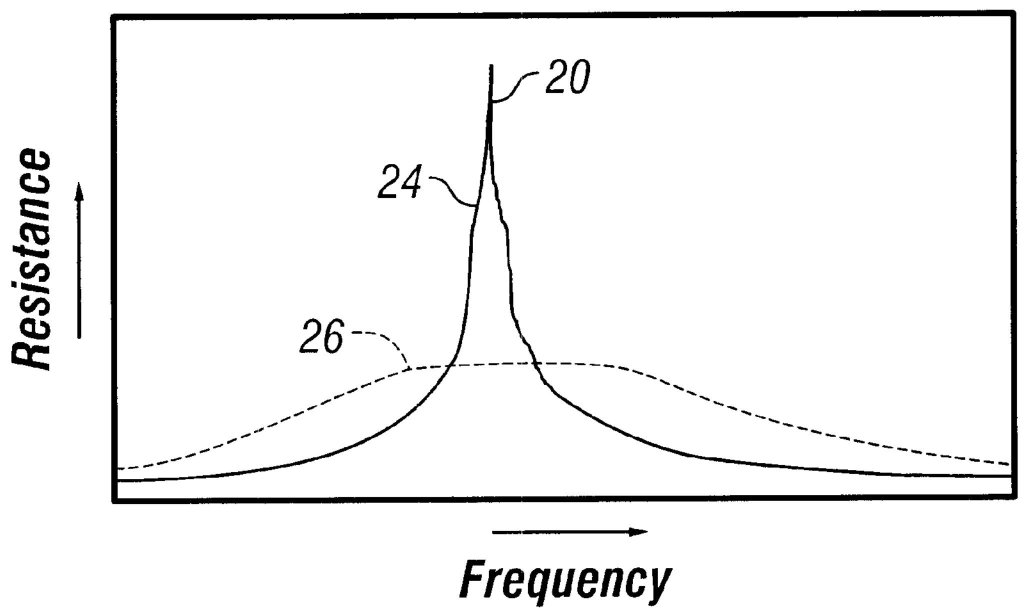
FIG. 2 shows a prior art graph of resistance versus frequency for the circuit shown in FIG. 1.
Figure 3:
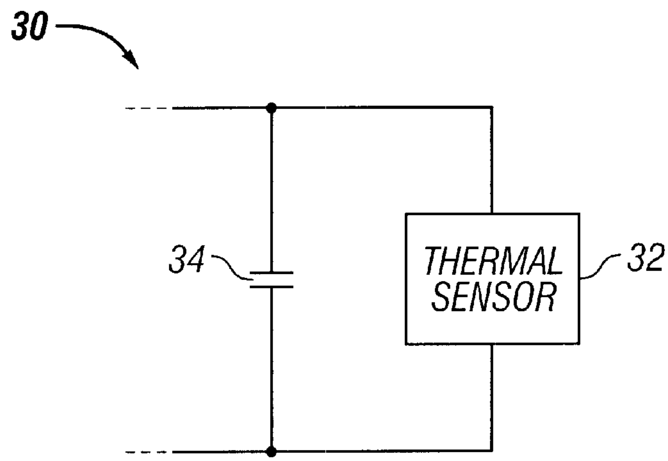
FIG. 3 shows a prior art schematic of a thermal sensor power supply system with a de-coupling capacitor.
Figure 4:
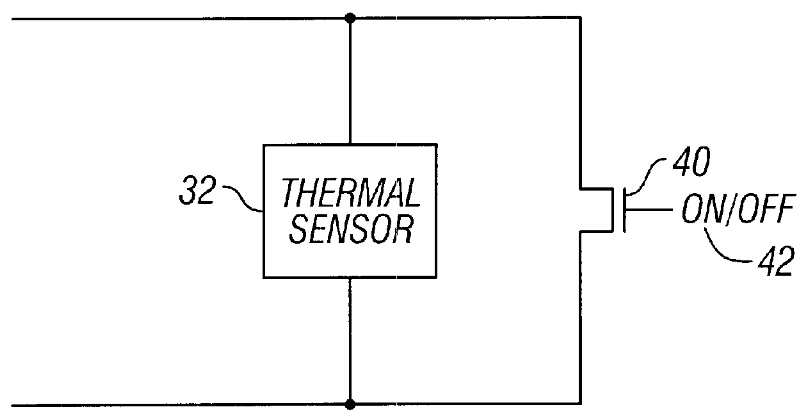
FIG. 4 shows a schematic of one embodiment of the present invention with a shunting resistance.

FIG. 4 shows a schematic of one embodiment of the present invention with a parallel shunting resistance. The circuit includes: a thermal sensor 32, and a shunting resistance component 40. The shunting resistor 40 is located in parallel with the thermal sensor 32. In this embodiment, the shunting resistance 40 is shown as an N-type transistor which means that the transistor is "on" (allows current to pass) when the ON/OFF signal 42 is "high". Conversely, the transistor 58 is "off" (does not allow current to pass) when the ON/OFF signal 42 is "low.

The effect of adding a resistance value in parallel to the component served by the power supply system has the effect is to lower the Q value and consequently lower the supply noise. In this embodiment, a transistor is used to provide a small amount of resistance to lower the Q value of the thermal sensor power supply. In this embodiment, the transistor is controlled with an ON/OFF signal 42. When the ON signal is activated, the transistor makes a connection in parallel across the power supply of the thermal sensor 32. The connection allows current to flow through the transistor, which acts as a relatively small resistor.

Figure 5:
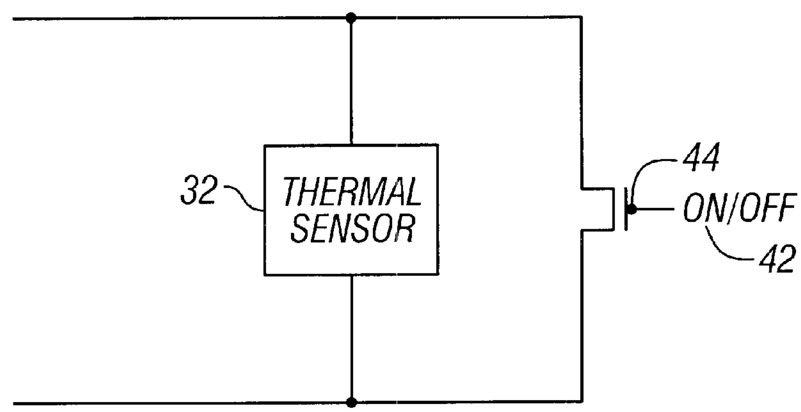
FIG. 5 shows a schematic of an alternative embodiment of the present invention with a shunting resistance.

FIG. 5 shows a schematic of one embodiment of the present invention with a parallel shunting resistance. The circuit includes: a thermal sensor 32, and a shunting resistance component 44 that is located in parallel with the thermal sensor 32. However, in this embodiment, the shunting resistance component 44 is a "P-type" transistor which means that the transistor is "on" (allows current to pass) when the ON/OFF signal 42 is low. Conversely, the transistor 56 is "off" (does not allow current to pass) when the ON/OFF signal 42 is high or ON. The P-type transistor operates in the same manner as the N-type transistor, except that it is activated off by the inverse signals. Consequently, the circuit in shown in FIG. 5 will operate in the same manner as the circuit in FIG. 4 except that it will be turned ON and turned OFF by an inverted signals.

While each of these embodiments has shown the shunting resistance component as a transistor, it should be clear to those of ordinary skill in the art that alternative shunting devices could be used. For example, a simple resistor located in parallel with the thermal sensor could perform the same function. Alternatively, a variable resistor could be used as well. Additionally, a simple switch could be added in series with the alternative type of resistance to control the shunting operation.

The ON/OFF signal 42 may be connected to an external circuit interface. In some embodiments, an industry standard interface such as "JTAG" could be used. However, any other suitable interface known to those of ordinary skill in the art could also be used. The purpose of the external interface is externally control of the shunt resistance. This allows greater flexibility in operating the circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing power supply noise of a thermal sensor, comprising:

supplying power to a thermal sensor; and connecting a resistance in parallel with the thermal sensor, wherein the resistance is activated and deactivated by an external signal.

2. The method of claim 1, wherein the resistance comprises a transistor.

3. The method of claim 2, wherein the transistor comprises an N-type transistor.

4. The method of claim 2, wherein the transistor comprises a P-type transistor.

5. The method of claim 1, wherein the resistance may be activated and de-activated independent of the thermal sensor.

6. The method of claim 1, wherein the external signal is transmitted through an external system interface.

7. The method of claim 6, wherein the external system interface is a JTAG.

8. A method for reducing power supply noise of a thermal sensor, comprising:

step of supplying power to the thermal sensor; and step of shunting a resistance in parallel with the thermal sensor, wherein the resistance is activated and deactivated by an external signal.

9. An apparatus for reducing power supply noise of a thermal sensor, comprising:

a thermal sensor;

a power supply system connected to the thermal sensor; and a shunting resistor connected across the power supply system in parallel with the thermal sensor, wherein the shunting resistor is activated and deactivated by an external signal.

10. The apparatus of claim 9, wherein the shunting resistor comprises a transistor.

11. The apparatus of claim 10, wherein the transistor comprises an N-type transistor.

12. The apparatus of claim 10, wherein the transistor comprises a P-type transistor.

13. The apparatus of claim 9, wherein the shunting resistor may be activated and deactivated independent of the thermal sensor.

14. The apparatus of claim 9, wherein the external signal is transmitted through an external system interface.

15. The apparatus of claim 14, wherein the external system interface is a JTAG.

16. An apparatus for reducing power supply noise of a thermal sensor, comprising:

means for supplying power to the thermal sensor; and means for connecting a resistance in parallel with the thermal sensor, wherein the resistance is activated and deactivated by an external signal.

* * * * *